(12) United States Patent
Lu et al.

(10) Patent No.: US 6,815,713 B2
(45) Date of Patent: Nov. 9, 2004

(54) PROCESS VIA MISMATCH DETECTING DEVICE

(75) Inventors: Ming-Huan Lu, Chu Pei (TW); Yi-Chang Hsieh, Hsinchu (TW); Hao-Luen Tien, Taipei (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 212 days.

(21) Appl. No.: 10/262,799

(22) Filed: Oct. 2, 2002

(65) Prior Publication Data

US 2004/0065879 A1 Apr. 8, 2004

(51) Int. Cl.[7] .............................................. H01L 23/58
(52) U.S. Cl. ............................................................ 257/48
(58) Field of Search ........................... 257/48, 508, 774, 257/758, 700, 632, 633, 701, 705, 713, 712; 438/106; 361/679

Primary Examiner—Long Pham
Assistant Examiner—Dana Farahani
(74) Attorney, Agent, or Firm—Thomas, Kayden, Horstemeyer & Risley

(57) ABSTRACT

A process via mismatch detecting device is disclosed. Because the vias in the detecting circuit of process via mismatch detecting device are mismatched while the vias between the metal layers of the chips are mismatched, by appropriately placing vias in detecting circuit of process via mismatch detecting device properly, metal lines of different metal layers in the detecting circuit can become short-circuited by mismatched vias, so as to output a voltage signal that is higher after vias mismatch and is regarded as the result of detecting via mismatch. Therefore, the direction and quantity of via mismatch between the metal layers in the chip are detected and monitored effectively, so as to optimize the process. Thus, the yield of process is increased and the cost is decreased.

24 Claims, 8 Drawing Sheets

PROCESS VIA MISMATCH DETECTING DEVICE

FIELD OF THE INVENTION

The present invention relates to a process via mismatch detecting device, and more particularly relates to a process via mismatch detecting device for detecting the misalignment of vias between various metal lines in a semiconductor process.

BACKGROUND OF THE INVENTION

With the progress of semiconductor process technologies, the size of device is smaller and continuously reduced even to a sub-micro size or deep sub-micro size. Meanwhile, the size of IC is also decreased, so that the density of IC is increased continuously.

However, when the density of IC is rapidly increased, the multilevel interconnection process is needed in order to meet the increasing demand of interconnection after the minimization of transistors due to no sufficient area for making interconnections on the surface of a semiconductor substrate. Therefore, the design using two or more metal layers has gradually become a necessary method adopted by many IC fabrications. Furthermore, especially for the products with complicated functions, such as microprocessors and application chips, the design even with five or more metal layers has to be utilized to complete the connections among the devices inside the product.

In order to isolate each metal line, an insulator has to be placed between each of the metal layers. This insulator is generally called an intermetal dielectric (IMD) or interlevel dielectric (ILD). Please referring to FIG. 1, FIG. 1 is a cross-sectional diagram showing a conventional multilevel interconnection structure of IC, wherein a chip 10 has a transistor layer 80 and three metal layers. As shown in FIG. 1, the intermetal dielectric 50 is utilized between a metal layer 20 and a metal layer 30 and between the metal layer 30 and a metal layer 40, so as to isolate the metal layers with each other thereby avoiding short circuits. Moreover, by utilizing photolithography, vias 60 are defined at appropriate positions on the dielectric layer, and then plugs 70 are formed in the vias 60 with conductive material, such as tungsten, so that the current can flow freely among the metal layer 20, the metal layer 30 and the metal layer 40 through the plugs 70. By utilizing the design of multilevel interconnection, the transistors can be mutually interconnected so as to form a complete circuit on the chip 10.

In the earlier stage, since the IC design does not use many metal layers (mostly uses two or three metal layers), and the critical dimension thereof is broader, the metallization process of multilevel interconnection is relatively easily to be performed. However, while the multilevel interconnection is processed on a design with four metal layers, the surface of deposition layer is not smooth but rough, so that it is not easy to make the deposition layers aligned with each other. Particularly, when the vias interconnecting each of the metal layers are misaligned, the electrical properties of devices will be seriously affected, thus decreasing the reliability of product.

SUMMARY OF THE INVENTION

In view of the background of the invention described above, with the rapidly increasing density of IC, multi-metal layers are widely utilized in the multilevel interconnection process for the devices on a chip. However, because multiple deposition layers are not easy to be mutually aligned, and moreover, the electrical property of device is seriously affected especially when the vias interconnecting each of the metal layers are misaligned, thus, decreasing the product reliability.

It is the principal object of the present invention to provide a process via mismatch detecting device, and more particularly relates to a process via mismatch detecting device for detecting the misalignment of vias between various metal lines in a semiconductor process. While the vias between metal layers of chips are mismatched, according to the present invention, the vias on the detecting circuits of process via mismatch detecting device are mismatched as well. Therefore, by placing the vias of detecting circuits on proper locations, metal lines in various metal layers of detecting circuits will be short circuited by mismatched vias, and a voltage higher than the previous voltage before short-circuiting is generated and is regarded as a detected result of process via mismatch detecting device. Consequently, it is accurate and efficient to detect whether the vias between metal layers of chip are mismatched or not, and to detect the quantity and direction of the mismatch thereof, thereby appropriately adjusting and optimizing the process.

In accordance with the aforementioned purpose of the present invention, the present invention provides a process via mismatch detecting device comprising: a detecting circuit that comprises a first metal layer and a second metal layer, and the first metal layer comprises a first metal line and a second metal line, wherein the distance between the first metal line of the first metal layer and the second metal line of the first metal layer is a metal-line distance value, and one terminal of the first metal line of the first metal layer and one terminal of the second metal line of the first metal layer are electrically connected to a power source, and the second metal layer comprises a first metal line, a second metal line and a third metal line, wherein one terminal of the first metal line of the second metal layer is electrically connected to one terminal of a first resistor, and another terminal of the first resistor is electrically connected to a ground, and one terminal of the second metal line of the second metal layer is electrically connected to one terminal of a second resistor, and another terminal of the second resistor is electrically connected to the ground, and one terminal of the third metal line of the second metal layer is electrically connected to one terminal of a third resistor, and another terminal of the third resistor is electrically connected to the ground, and the first metal layer is located above the second metal layer and is placed orthogonally to the second metal layer, a dielectric layer located between the first metal layer and the second metal layer, wherein according to a predetermined via placement method, a first via is formed at a first predetermined location of the dielectric layer corresponding to the first metal line of the second metal layer, and a second via is formed at a second predetermined location of the dielectric layer corresponding to the second metal line of the second metal layer, and a third via is formed at a third predetermined location of the dielectric layer corresponding to the third metal line of the second metal layer; and a register having a first input terminal, a second input terminal, a third input terminal and an output terminal, wherein the first input terminal is electrically connected to another terminal of the first metal line of the second metal layer, and the second input terminal is electrically connected to another terminal of the second metal line of the second metal layer, and the third input terminal is electrically connected to another terminal of the third metal line of the second metal layer, and the output terminal outputs a detected result of the process via mismatch detecting device.

By utilizing the process via mismatch detecting device of the present invention, in order to accurately and efficiently detect the direction and quantity of mismatched via between metal layers in a chip, the vias of process via mismatch detecting device can be placed properly according to the quantity of metal layers in the chip and the required sensitivity of detecting via mismatch, so that proper adjustment can be made so as to increase the yield and to decrease the cost.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
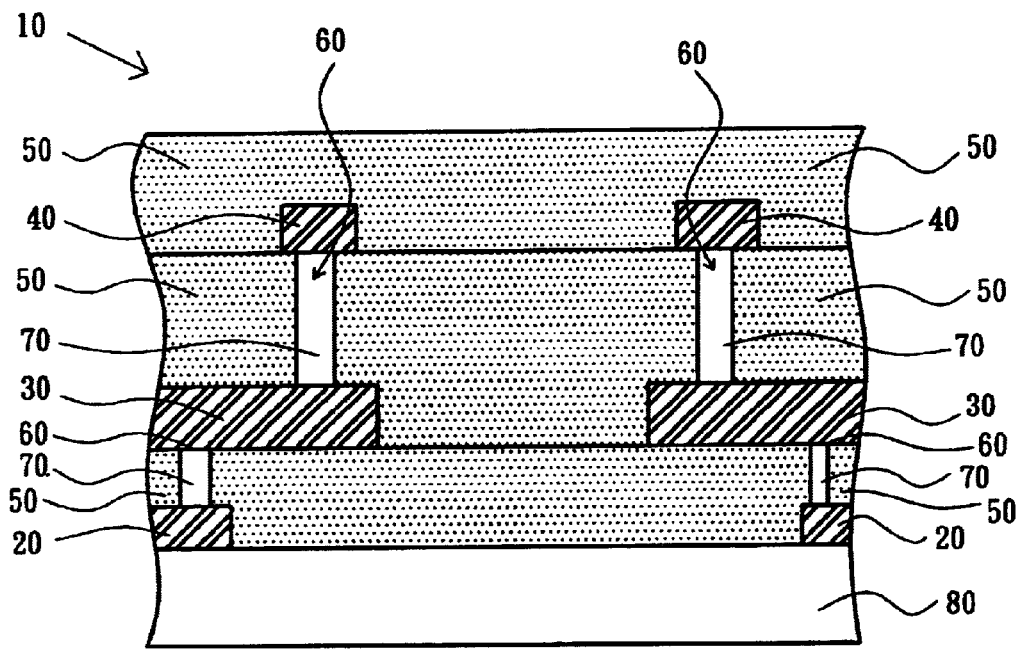
FIG. 1 is a cross-sectional diagram showing a conventional multilevel interconnection structure of IC.
Figure 2:
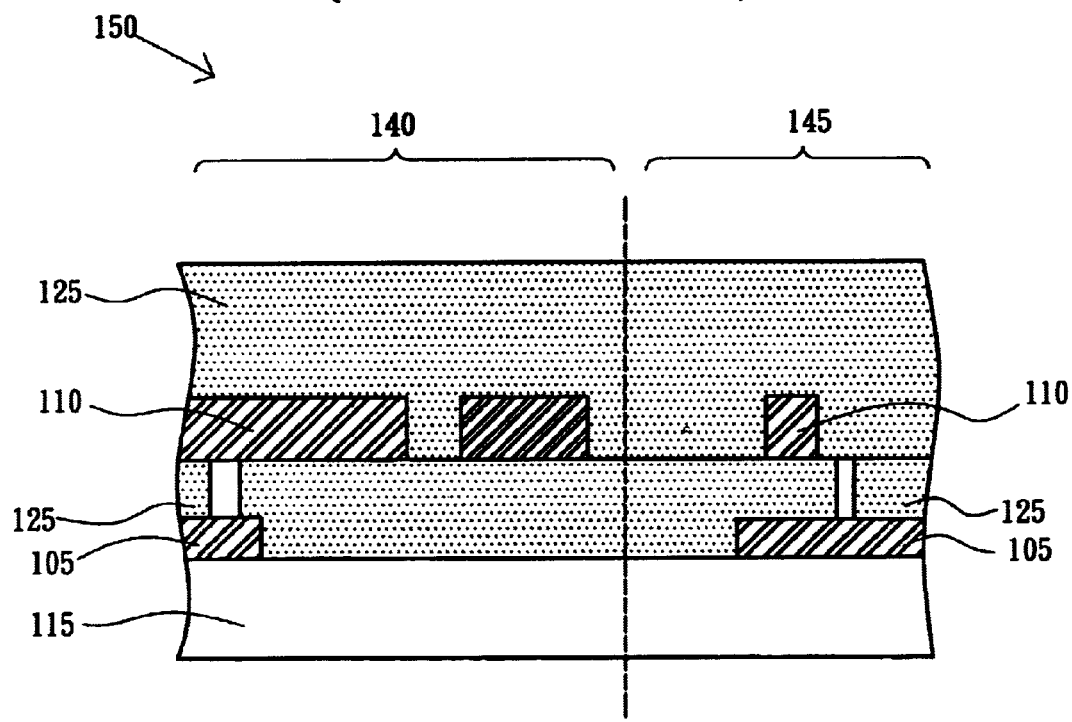
FIG. 2 is a cross-sectional diagram showing an embodiment of the present invention applied on a chip.

Please referring to FIG. 2, FIG. 2 is a cross-sectional diagram showing an embodiment of the present invention applied on a chip, wherein a chip 150 has a transistor layer 115 and two metal layers (i.e. a metal layer 105 and a metal layer 110), wherein a plurality of dielectric layers 125 cover the metal layer 105 and the metal layer 110 for insulation, and an IC is located on the first region 140 of the chip 150. As shown in FIG. 2, the process via mismatch detecting device of the present invention is located on the second region 145 of the chip 150. In the process via mismatch detecting device of the present invention, the quantity of the metal layers, and the quantity of the metal lines in each metal layer, etc., are determined in accordance with the quantity of the metal layers in the chip and the required detecting sensitivity. Since the chip 150 has two metal layers structure, the process via mismatch detecting device in the second region 145 has two metal layers also.

Figure 3:
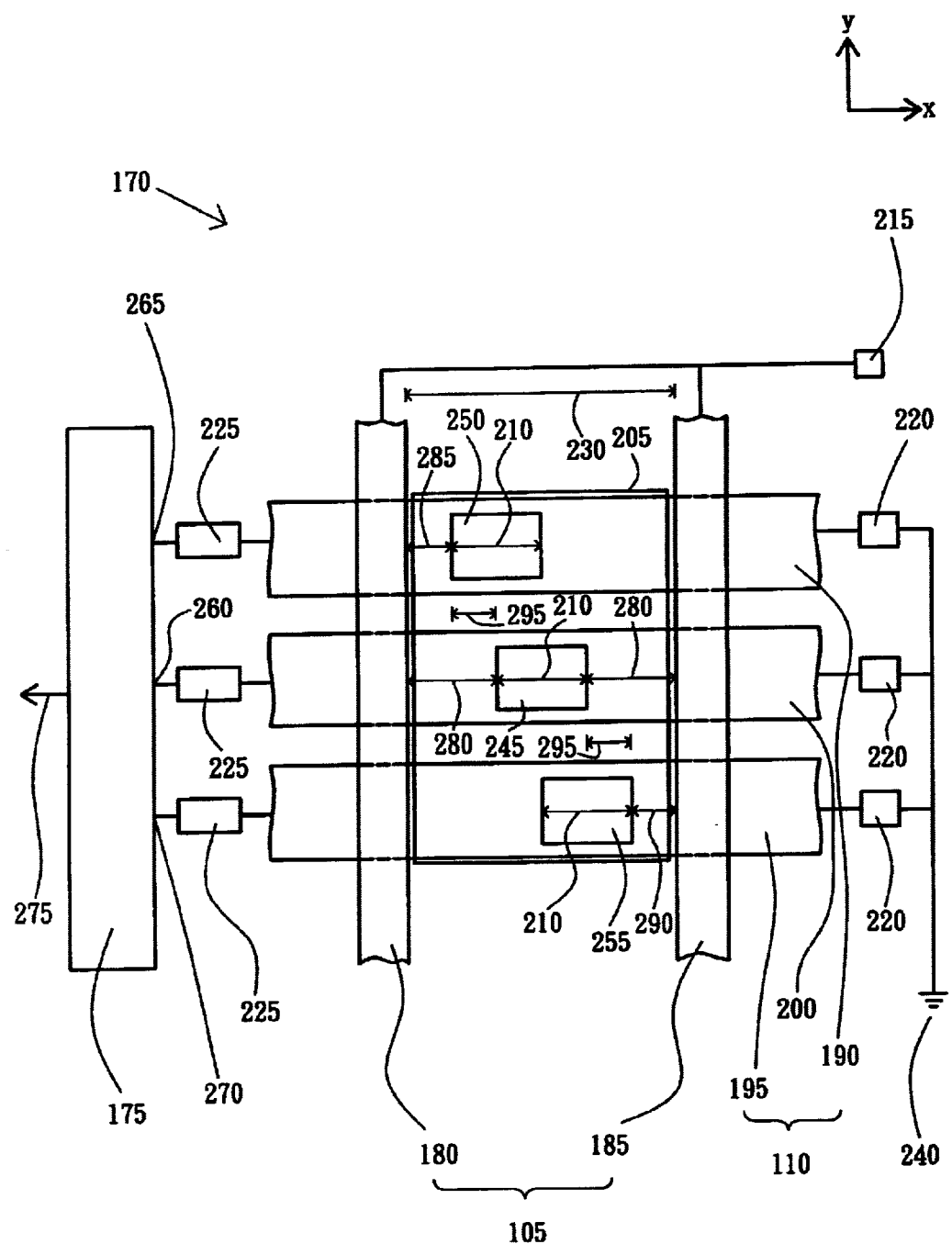
FIG. 3 is a top perspective view showing an embodiment of the present invention.

Please referring to FIG. 2 and FIG. 3, FIG. 3 is a top perspective view showing an embodiment of the present invention. In FIG. 3, when the process via mismatch detecting device 170 of the present invention is applied on a chip having two metal layers, the process via mismatch detecting device 170 is composed of two metal layers (i.e. a metal layer 105 and a metal layer 110) and a register 175, wherein a dielectric layer (not shown) is formed between the metal layer 105 and the metal layer 110 for insulation.

In order to describe the operation theorem of process via mismatch detecting device 170 concisely, let the metal layer 110 shown in FIG. 3 merely have three metal lines (a metal line 190, a metal line 195 and a metal line 200), and moreover, the metal layer 105 be placed orthogonally to the metal layer 110, so that a rectangular region 205, on where several vias to be formed in the subsequent steps are located, is obtained and composed of the metal lines 180 and 185 located on the metal layer 105 and the metal lines 190 and 195 located on the metal layer 110. On the other hand, as shown in FIG. 3, the metal lines 180 and 185 located on the metal layer 105 are electrically connected to a power source 215 respectively. A terminal of the metal line 190 on the metal layer 110 is electrically connected to a resistor 220 that is electrically connected to ground 240, and another terminal of the metal line 190 is electrically connected to a register 175 through a buffer module 225. Similarly, a terminal of the metal line 195 on the metal layer 110 is electrically connected to a resistor 220 that is electrically connected to ground 240, and another terminal of the metal line 195 is electrically connected to a register 175 through a buffer module 225, and a terminal of the metal line 200 on the metal layer 110 is electrically connected to a resistor 220 that is electrically connected to ground 240, and another terminal of the metal line 200 is electrically connected to a register 175 through a buffer module 225.

While the vias between metal layers in the first region 140 of the chip 150 are formed, if the locations of vias are shifted, then the metal layers are not electrically conducted through vias, or, though the metal layers are electrically conducted through mismatched vias, yet the contact resistance therebetween is increased thus decreasing the current, so that the operation of device is affected.

Hence, in the process via mismatch detecting device 170 of the present invention, according to the required sensitivity of detecting via mismatch, the mismatch range of via and the size of via, etc., the vias are placed within the rectangle region 205 of the dielectric layer between the metal layer 105 and the metal layer 110. When the vias in the chip 150 shown in FIG. 2 are not mismatched, the vias 245, 250 and 255 located on the process via mismatch detecting device are not mismatched either, so that the metal lines 180 and 185 of the metal layer 105 are not electrically conducted to the metal lines 190 or 195 or 200 of the metal layer 110 through any one of the vias 245, 250 and 255. Therefore, the metal line 190, the metal line 195 and the metal line 200 still keep at low potentials, which are recorded in the register 175, so that it can be known that the vias of the chip 150 are not mismatched by checking the output of register 175.

When the vias of the chip 150 are mismatched, the vias 245, 250 and 255 located on the process via mismatch detecting device 170 are mismatched as well, so that the metal line 180 or the metal line 185 is electrically conducted to the metal line 190 or the metal line 195 or the metal line 200 through the mismatched vias 245, 250 and 255. Since the metal line 180 and the metal line 185 are electrically connected to a power source 215, the potential of the metal line 190 or that of the metal line 195 or that of the metal line 200 is increased after the metal line 190 or the metal line 195 or the metal line 200 is short-circuited with the metal line 180 or the metal line 185, wherein the register 175 records the potentials of the metal line 190, the metal line 195 and the metal line 200. Therefore, it can be known that the potential of metal line 190 or that of the metal line 195 or that of the metal line 200 is increased by checking the output of register 175, wherein the potential increase infers that the vias on the chip 150 have deviated towards the metal line 180 or the metal line 185. The following example is used for describing the via placement principle of the process via mismatch detecting device 170 as shown in FIG. 3 and the related operation theorem.

For example, when implementing the process via mismatch detecting device 170 shown in FIG. 3, if the required detecting range of detecting via mismatch range is about 0.28 $\mu$m, and the required sensitivity of detecting via mismatch is about 0.14 $\mu$m (herein the required sensitivity of detecting via mismatch indicates the smallest mismatch value of via by utilizing the process via mismatch detecting device 170 shown in FIG. 3), and the size of each via is about 0.28 $\mu$m. First, according to the size 210 of via 245 (i.e. about 0.28 $\mu$m) and the required detecting range of detecting via mismatch range (i.e. about 0.28 $\mu$m), the metal line distance 230 between the metal line 180 and the metal line 185 is known and is about 0.84 $\mu$m; then according to the size 210 of via 245 and the required detecting range of detecting via mismatch range, the required detecting range of detecting via mismatch range is regarded as a corresponding distance 280, and the via 245 is placed in the dielectric layer corresponding to the metal line 200, so that both the corresponding distance 280 between the via 245 and the metal line 180 and the corresponding distance 280 between the via 245 and the metal line 185 are about 0.28 $\mu$m; then the required sensitivity of detecting via mismatch is regarded as the corresponding distance 285, the via 250 is placed in the dielectric layer corresponding to the metal line 190, so that the corresponding distance 285 between the via 250 and the metal line 180 is about 0.14 $\mu$m, and the distance between the via 250 and the metal line 185 is about 0.42 $\mu$m; finally, the required sensitivity of detecting via mismatch is regarded as the corresponding distance 290, the via 255 is placed in the dielectric layer corresponding to the metal line 195, so that the corresponding distance 290 between the via 255 and the metal line 185 is about 0.14 $\mu$m, and the distance between the via 255 and the metal line 180 is about 0.42 $\mu$m.

By the aforementioned via placement method, if the vias between the metal layer 105 and the metal layer 110 in the chip 150 are mismatched, the vias 245, 250 and 255 in the process via mismatch detecting device 170 are mismatched meanwhile.

If the mismatched distance of vias between the metal layer 105 and the metal layer 110 of chip 150 is between 0.14 $\mu$m and 0.28 $\mu$m (larger than the required sensitivity of detecting via mismatch) along the negative x direction, the mismatched distance of the vias 245, 250 and 255 on the process via mismatch detecting device is also between 0.14 $\mu$m and 0.28 $\mu$m. Since the corresponding distance 285 between the via 250 and the metal line 180 is about 0.14 $\mu$m, the metal line 180 can be short-circuited with the metal line 190 through the mismatched via 250. Because the metal line 180 is electrically connected to the power source 215, the potential of the metal line 190 is increased after being short-circuited with the metal line 180. However, the potentials of the metal line 195 and the metal line 200 still stay low because the metal line 180 and the metal line 185 are not electrically conducted with the metal line 195 or the metal tine 200 through the mismatched via 245, or the mismatched via 250, or the mismatched via 255. Therefore, the register 175 records that the input terminal 265 has a high potential, and the input terminal 260 and the input terminal 270 have a low potential, so that, through the result outputted from the output terminal 275 of the register 175, the personals can recognize that the mismatched distance of vias on the chip 150 is between 0.14 $\mu$m and 0.28 $\mu$m along the negative x direction.

Similarly, if the mismatched distance of vias between the metal layer 105 and the metal layer 110 on the chip 150 is between 0.14 $\mu$m and 0.28 $\mu$m along the positive x direction, the mismatched distance of vias 245, 250 and 255 on the process via mismatch detecting device 170 is also between 0.14 $\mu$m and 0.28 $\mu$m along the positive x direction. Since the corresponding distance 290 between the via 255 and the metal line 185 is about 0.14 $\mu$m, the metal line 185 are electrically conducted with the metal line 195 through the mismatched via 255. Because the metal line 185 is electrically connected to the power source 215, the potential of the metal line 195 is increased after being short-circuited with the metal line 185. However, the potentials of the metal line 190 and 200 still stay low because the metal line 185 and the metal line 180 are not electrically conducted with the metal line 190 or the metal line 200 through the mismatched via 245, or the mismatched 250, or the mismatched via 255. Therefore, the register 175 records that the input terminal 270 has a high potential, and the input terminal 260 and the input terminal 265 have a low potential, so that, through the result outputted from the output terminal 275 of the register 175, the personals can recognize that the mismatched distance of vias on the chip 150 is between 0.14 $\mu$m and 0.28 $\mu$m along the positive x direction.

If the mismatched distance of vias between the metal layer 105 and the metal layer 110 on the chip 150 is larger than 0.28 $\mu$m along the positive x direction or the negative x direction, the mismatched distance of vias 245, 250 and 255 on the process via mismatch detecting device 170 is also larger than 0.28 $\mu$m along the positive x direction or the negative x direction. Since the corresponding distance 285 between the via 250 and the metal line 180 is about 0.14 $\mu$m and the corresponding distance 290 between the via 255 and the metal line 185 is about 0.14 $\mu$m, the vias are shifted towards either positive x direction or negative x direction, so that the metal line 180 can be electrically conducted with the metal line 190 through the mismatched via 250 and with the metal line 200 through the mismatched via 245 (if the vias are shifted towards negative x direction), or the metal line 185 can be electrically conducted with the metal line 200 through the mismatched via 245 and with the metal line 195 through the mismatched via 255 (if the vias are shifted towards positive x direction).

Because the metal line 180 and the metal line 185 are electrically connected to the power source 215, if the vias are shifted towards negative x direction, the potentials of the metal lines 190 and 200 are increased but the potentials of the metal line 195 still stay low. The register 175 records that the input terminals 265 and 260 have a high potential, but the input terminal 270 has a low potential, and the result is outputted from the output terminal 275 of the register 175. If the vias are shifted towards positive x direction, the potentials of the metal lines 200 and 195 are increased but the potentials of the metal line 190 still stay low. The register 175 records that the input terminals, 260 and 270 have a high potential, but the input terminal 265 has a low potential, and the result is outputted from the output terminal 275 of the register 175. Therefore, the personals can recognize that the mismatched distance and mismatched direction of vias on the chip 150.

On the other hand, if the mismatched distance of the vias on the chip are less than 0.14 $\mu$m along the negative x direction or the positive x direction, the vias 245, 250 and 255 of process via mismatch detecting device are mismatched as well. However, since the distance between the via 250 and the metal line 180 is about 0.14 µm correspondingly, and the distance between the via 255 and the metal line 185 is about 0.14 µm correspondingly as well, so that the metal line 180 can not be electrically conducted with the metal line 190, or the metal line 195, or the metal line 200 through the vias 245, 250 and 255, and similarly, the metal line 185 can not be electrically conducted with the metal line 190, or the metal line 195, or the metal line 200 through the vias 245, 250 and 255. Thus, The register 175 records that the input terminals 260, 265 and 270 have a low potential. Hence, the personals can not recognize that the mismatched state, such as mismatched distance and mismatched direction, of vias on the chip 150. Therefore, if the sensitivity of detecting via mismatch needs to be increased, the corresponding distance 295 between vias has to be decreased.

Moreover, in order to increase the sensitivity of detecting via mismatch for obtaining an accurate mismatched distance of via while the vias on the chip are mismatched, a method is utilized for increasing the sensitivity of detecting mismatch, wherein the method comprises: utilizing a plurality of metal lines in the metal layer 110 of process via mismatch detecting device; increasing the quantity of vias placed in the dielectric layer between the metal layer 105 and the metal layer 110; and decreasing the corresponding distance between each of the vias. The related description is shown in the following example.

Figure 4:
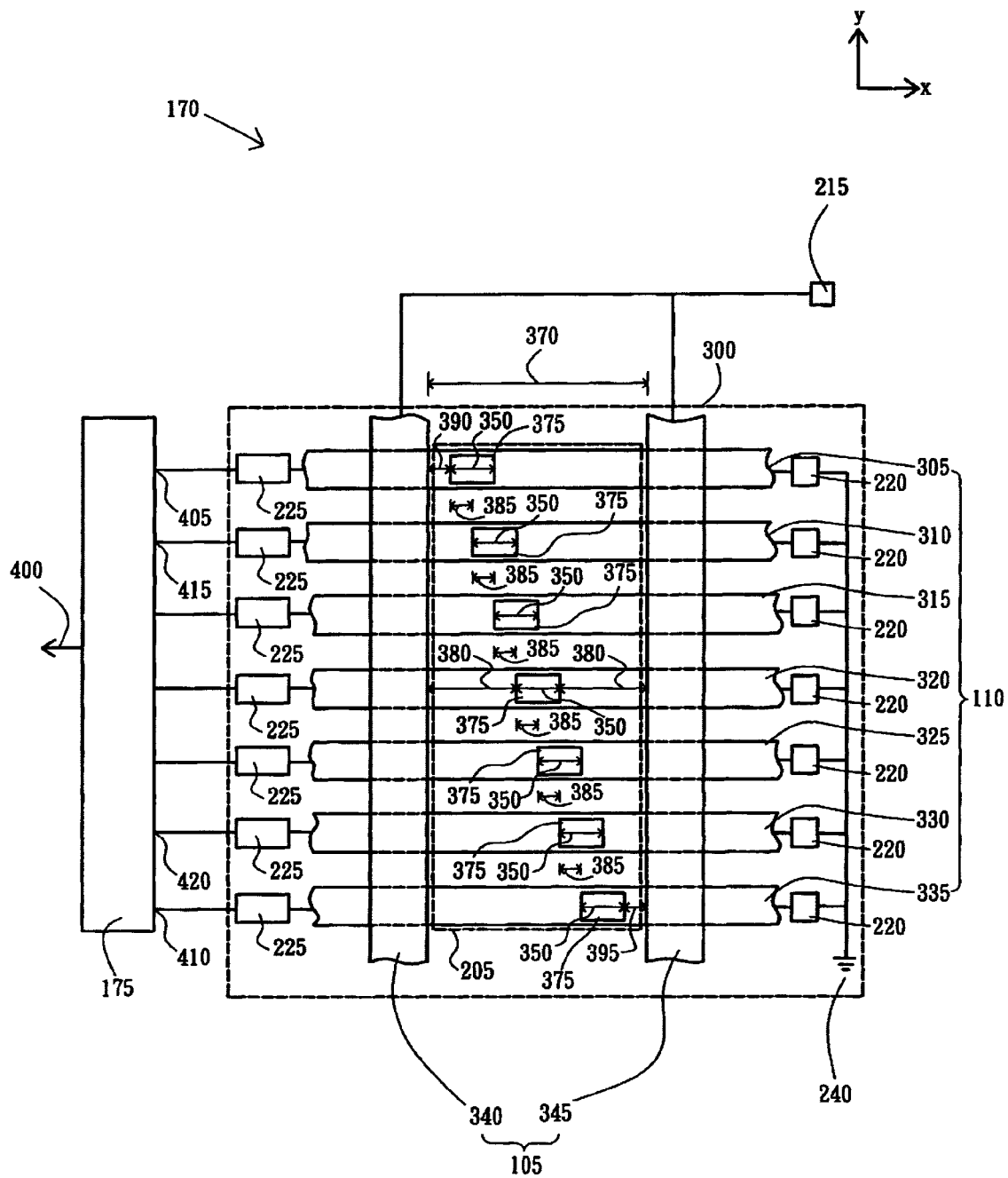
FIG. 4 is a top perspective view showing another embodiment of the present invention.

Please referring to FIG. 4, FIG. 4 is a top perspective view showing another embodiment of present invention. In FIG. 4, if the process via mismatch detecting device of the present invention is applied on a chip having two metal layers, the process via mismatch detecting device is constituted with a detecting circuit 300 and a register 175. The detecting circuit 300 is mainly constituted with two metal layers (i.e. a metal layer 105 and a metal layer 110), and the metal lines of the metal layer 105 are placed orthogonally to the metal lines of the metal layer 110, and there is a dielectric layer (not shown) formed between the metal layer 105 and the metal layer 110.

If the metal layer 105 is composed of a metal line 340 and a metal line 345, and the required detecting range of detecting via mismatch range is about 0.12 µm, and the required sensitivity of detecting via mismatch is about 0.03 µm (herein the required sensitivity of detecting via mismatch is equal to the corresponding distance 295), and the size 350 of a via 375 is about 0.28 µm, the quantity of metal lines of the metal layer 110 can be resolved according to a formula (1) of predetermined via placement method.

the quantity of metal lines of the second metal layer =(the required detecting range)/

(the required sensitivity of detecting via mismatch)
x 2−1     Formula (1);

Let say the metal layer 105 is the first metal layer and the metal layer 110 is the second metal layer in the formula (1). Based on the required detecting range of detecting via mismatch range, which is about 0.12 µm, and the required sensitivity of detecting via mismatch, which is about 0.03 µm, the quantity of metal lines included in the metal layer 110 is seven by utilizing the formula (1). That means the metal layer 110 is at least composed of seven metal lines (i.e. metal lines 305, 310, 315, 320, 325, 330 and 335), so that the metal lines 340, 345, 305 and 335 are formed to a rectangular 205, within which the vias are placed in subsequent steps.

Moreover, according to the required detecting range of detecting via mismatch range, which is about 0.12 µm, and the size 350 of via 375, which is about 0.28 µm, it is further known that in FIG. 4 the metal line distance 370 between the metal line 340 and the metal line 345 is about 0.52 µm, and the corresponding distance 390 between the metal line 340 and the via 375 in the dielectric layer corresponding to the metal line 305 is about 0.03 µm (equal to the required sensitivity of detecting via mismatch), and the corresponding distance 395 between the metal line 345 and the via 375 in the dielectric layer corresponding to the metal line 335 is about 0.03 µm (equal to the required sensitivity of detecting via mismatch). Meanwhile, the corresponding distance 385 between vias 375 is about 0.03 µm also(equal to the required sensitivity of detecting via mismatch).

Furthermore, as shown in FIG. 4, the metal lines 340 and 345 of the metal layer 105 are electrically connected to the power source 215 respectively. A terminal of each of the metal lines of the metal layer 110 is electrically connected to a resistor 220, and each of the resistors 220 is electrically connected to the ground 240 respectively. Another terminal of each of the metal lines of the metal layer 110 is electrically connected to a register 175 through a buffer module 225 respectively.

By utilizing the process via mismatch detecting device 170 shown in FIG. 4, if the mismatched distance of vias between the metal layers on the chip 150 is between about 0.03 µm to about 0.06 µm along the negative x direction, the vias 375 on the process via mismatched detecting device 170 are also mismatched between about 0.03 µm to about 0.06 µm along the negative x direction as well. Because the corresponding distance 390 between the metal line 340 and the via 375 in the dielectric layer corresponding to the metal line 305 is about 0.03 µm, the metal line 340 can be electrically conducted with the metal line 305 through the mismatched via 375. Meanwhile, since the metal line 340 is electrically connected to the power source 215, the potential of the metal line 305 is increased after the metal line 305 is short-circuited with the metal line 340. However, the potentials of other metal lines on the metal layer 110 still stay low, because other metal lines on the metal layer 110 are not electrically conducted with the metal line 340 or the metal line 345 through mismatched vias 375. Therefore, the register 175 records that the input terminal 405 has a high potential and other input terminals have low potentials. After checking the result outputted from the output terminal 400 of register 175, the personals can know that the mismatched distance of vias between the metal layers on the chip 150 is between about 0.03 µm to about 0.06 µm along the negative x direction.

Similarly, if the mismatched distance of vias between the metal layers on the chip 150 is between about 0.03 µm to about 0.06 µm along the positive x direction, the vias 375 of process via mismatched detecting device are also mismatched between about 0.03 µm to about 0.06 µm along the positive x direction as well. Because the corresponding distance 395 between the metal line 345 and the via 375 in the dielectric layer corresponding to the metal line 335 is about 0.03 µm, the metal line 345 is electrically conducted with the metal line 335 through the mismatched via 375. Meanwhile, since the metal line 345 is electrically connected to the power source 215, the potential of the metal line 335 is increased after the metal line 335 is short-circuited with the metal line 345. However, the potentials of other metal lines of the metal layer 110 still stay low, because other metal lines on the metal layer 110 are not electrically conducted to the metal line 340 or the metal line 345 through the mismatched vias 375. Therefore, the register 175 records that the input terminal 410 has a high potential and other input terminals have low potentials. After checking the result outputted from the output terminal 400 of the register 175, the personals can know that the mismatched distance of vias between the metal layers on the chip 150 is between about 0.03 $\mu$m to about 0.06 $\mu$m along the positive x direction.

On the other hand, if the mismatched distance of vias between the metal layers on the chip 150 is from about 0.06 $\mu$m to about 0.09 $\mu$m along the negative x direction, the vias 375 on the process via mismatched detecting device 170 are also mismatched between about 0.06 $\mu$m to about 0.09 $\mu$m along the negative x direction as well. Because the corresponding distance 390 between the metal line 340 and the via 375 in the dielectric layer corresponding to the metal line 305 is about 0.03 $\mu$m, and the corresponding distance from the metal line 340 to the via 375 in the dielectric layer corresponding to the metal line 310 is about 0.06 $\mu$m (i.e. the corresponding distance 390 plus the corresponding distance 385 between two vias 375), thus, the metal line 340 is electrically conducted with the metal line 305 through the mismatched via 375, and the metal line 340 can be electrically conducted with the metal line 310 through the mismatched via 375. Meanwhile, since the metal line 340 is electrically connected to the power source 215, the potential of the metal line 305 is increased after the metal line 305 is short-circuited with the metal line 340, and the potential of the metal line 310 is increased after the metal line 310 is short-circuited with the metal line 340. However, the potentials of other metal lines on the metal layer 110 still stays low, because other metal lines on the metal layer 110 can not be electrically conducted with the metal line 340 or the metal line 345 through the mismatched vias 375. Therefore, the register 175 records that the input terminal 405 and the input terminal 415 have a high potential, and other input terminals have low potentials. After checking the result outputted from the output terminal 400 of register 175, the personals can know that the mismatched distance of vias between the metal layers on the chip 150 is between about 0.06 $\mu$m to about 0.09 $\mu$m along the negative x direction.

Similarly, if the mismatched distance of vias between the metal layers on the chip 150 is between about 0.06 $\mu$m to about 0.09 $\mu$m along the positive x direction, the vias 375 on the process via mismatched detecting device are also mismatched between about 0.06 $\mu$m to about 0.09 $\mu$m along the positive x direction as well. Because the corresponding distance 395 between the metal line 345 and the via 375 in the dielectric layer corresponding to the metal line 335 is about 0.03 $\mu$m, and the corresponding distance between the metal line 345 and the via 375 in the dielectric layer corresponding to the metal line 330 is about 0.06 $\mu$m (i.e. the corresponding distance 395 plus the corresponding distance 385 between two vias 375), thus, the metal line 345 can be electrically conducted with the metal line 335 through the mismatched via 375, and the metal line 345 can be electrically conducted with the metal line 330 through the mismatched via 375. Meanwhile, since the metal line 345 is electrically connected to the power source 215, the potential of metal line 335 is increased after the metal line 335 is short-circuited with the metal line 340, and the potential of metal line 330 is increased after the metal line 330 is short-circuited with the metal line 340. However, the potentials of other metal lines on the metal layer 110 still stays low, because other metal lines on the metal layer 110 can not be electrically conducted with the metal line 340 or the metal line 345 through mismatched vias 375. Therefore, the register 175 records that the input terminal 410 and the input terminal 420 have a high potential, and other input terminals have low potentials. After checking the result outputted from the output terminal 400 of the register 175, the personals can know that the mismatched distance of vias between the metal layers on the chip 150 is between about 0.06 $\mu$m to about 0.09 $\mu$m along the positive x direction.

In the process via mismatch detecting device 170 shown in FIG. 4, the corresponding distance 385 between two vias 375 is about 0.03 $\mu$m; the corresponding distance 390 between the metal line 340 and the via 375 in the dielectric layer corresponding to the metal line 305 is about 0.03 $\mu$m; the corresponding distance 395 between the metal line 345 and the via 375 in the dielectric layer corresponding to the metal line 335 is about 0.03 $\mu$m; the corresponding distance between the metal line 340 and the via 375 in the dielectric layer corresponding to the metal line 320 and the corresponding distance between the metal line 345 and the via 375 in the dielectric layer corresponding to the metal line 320 are about 0.12 $\mu$m. Thus, when the vias between the metal layers on the chip 150 are mismatched along the positive x direction or the negative x direction, and the mismatched distance is between about 0.03 $\mu$m to about 0.12 $\mu$m, the operation theorem of process via mismatch detecting device 170 as shown in FIG. 4 is the same as the description above. After checking the potential of each of the metal lines of metal layer 110 from the output terminal 400 of the register 175, the mismatched direction and mismatched distance of vias between the metal layers on the chip 150 can be known, so as to perform the corresponding optimization.

In FIG. 3 and FIG. 4, the process via mismatch detecting device 170 according to the present invention is applied on a chip having two metal layers, and the process via mismatch detecting device 170 is mainly composed of a detecting circuit 300 and the register 175, wherein the detecting circuit 300 is composed of two metal layers, i.e. the metal layer 105 and the metal layer 10.

Figure 5:
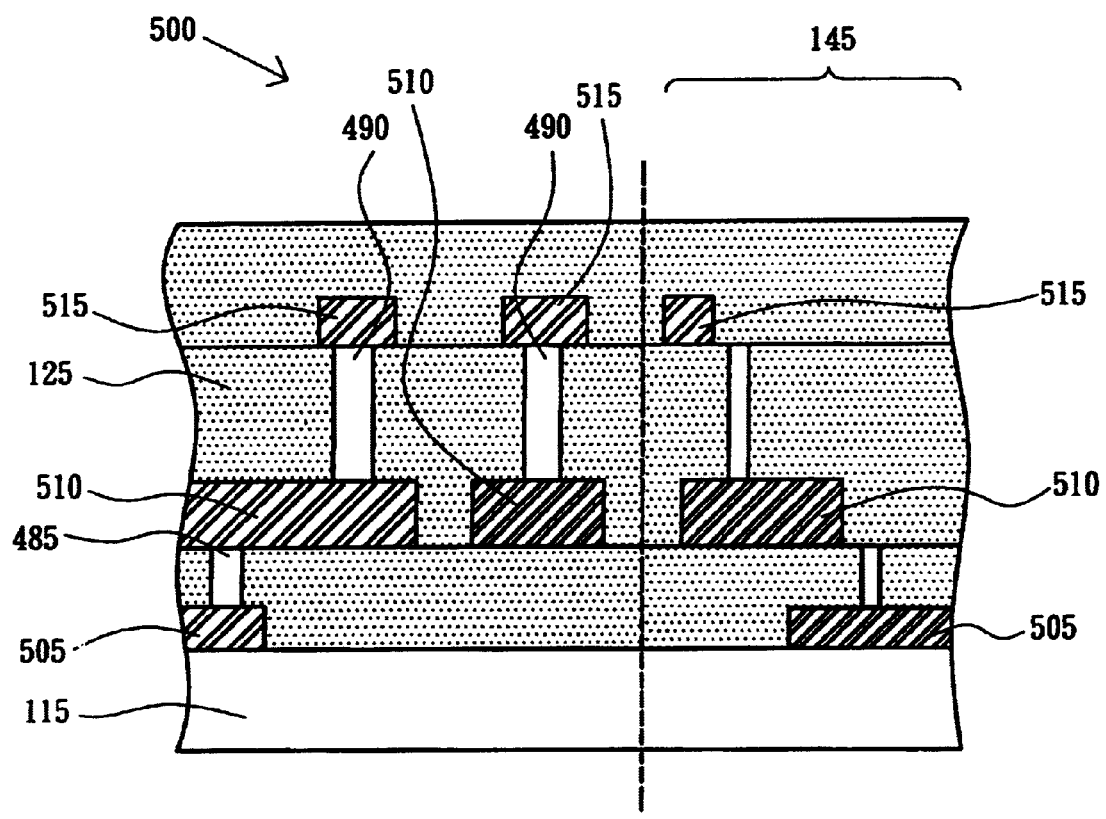
FIG. 5 is a cross-sectional diagram showing the process via mismatch detecting device of the present invention applied on a chip having three metal layers.

When the process via mismatch detecting device 170 according to the present invention is applied on a chip having more than two metal layers, please refer to FIG. 5, wherein FIG. 5 is a cross-sectional diagram showing the process via mismatch detecting device of present invention applied on a chip having three metal layers. As shown in FIG. 5, since a chip 500 has three metal layers, i.e. a metal layer 505, a metal layer 510 and a metal layer 515, wherein there are dielectric layers covering each of the metal layers for insulation. Thus, the process via mismatch detecting device located on the second region 145 of the chip 500 has two detecting circuits corresponding to the three metal layers of chip 500 for detecting the mismatch situation of vias among the metal layers.

In order to discriminate the mismatch of vias 485 between the metal layer 505 and the metal layer 510 from the mismatch of vias 490 between the metal layer 510 and metal layer 515, the process via mismatch detecting device shown in FIG. 5 further comprises a metal-layer insulation module in each of the detecting circuits and an addressing module for discriminating and recording detected results of via mismatch on different metal layers. With regard to the connection of the addressing module; metal-layer insulation modules; each of the metal layers in the process via mismatch detecting device; and the operation thereof, please refer to FIG. 6.

Figure 6:
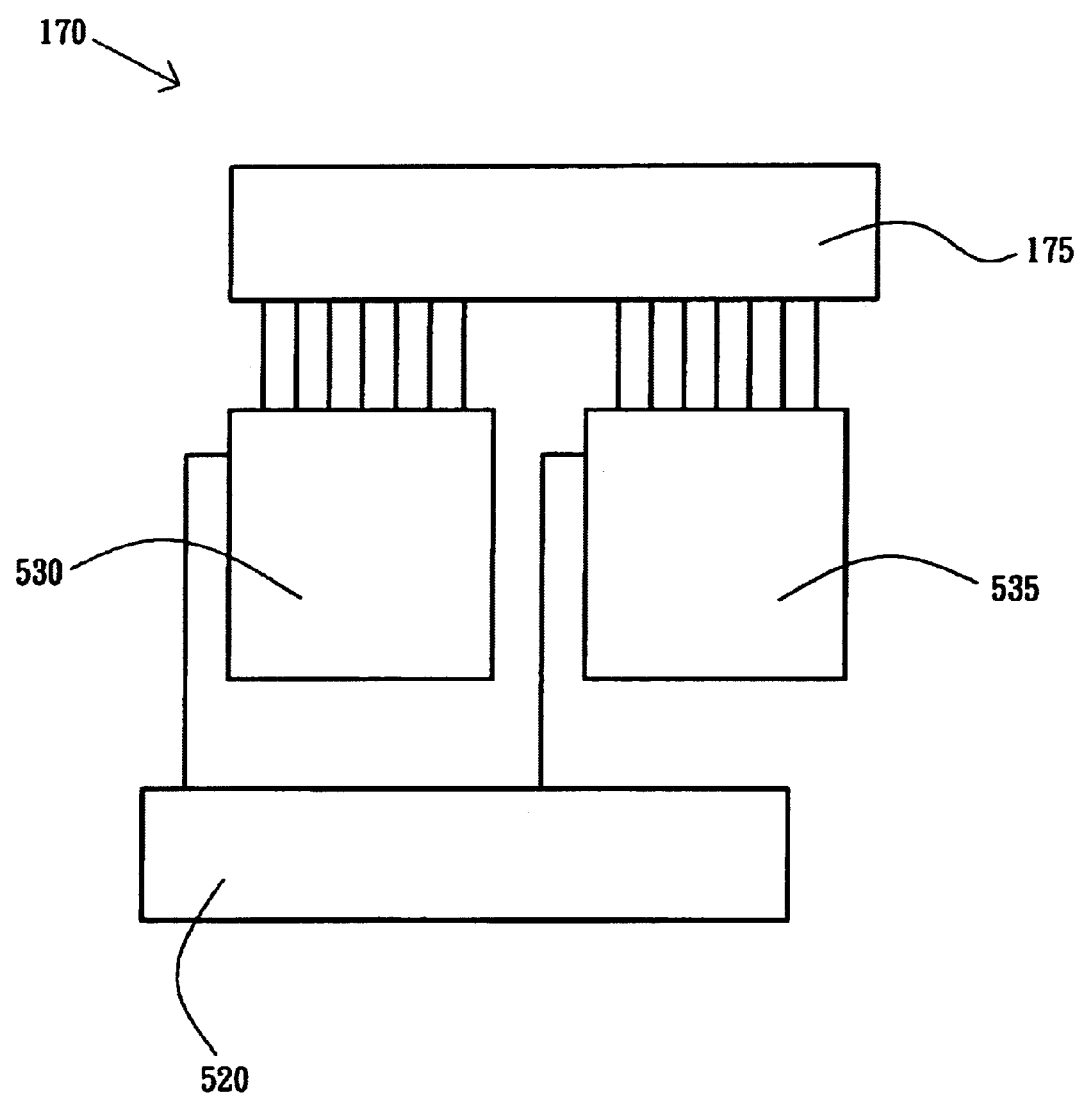
FIG. 6 is a diagram showing the connecting relationship among the components in a preferred embodiment of the present invention according to FIG. 5.

FIG. 6 is a diagram showing the connection of each of the components in a preferred embodiment of the present invention according to FIG. 5. As shown in FIG. 6, in order to detect the mismatched distance of vias between the metal layer 505 and the metal layer 510 on the chip 500 and to detect the mismatched distance of vias between the metal layer 510 and the metal layer 515 on the chip 500, the process via mismatch detecting device 170 is composed of a register 175, an addressing module 520 and two detecting circuits (i.e. a detecting circuit 530 and a detecting circuit 535), wherein each of the detecting circuits further comprises a metal-layer insulation module. The components forming each of the detecting circuits and the operation theorem of the process via mismatch detecting device 170 are described as follows.

Figure 7:
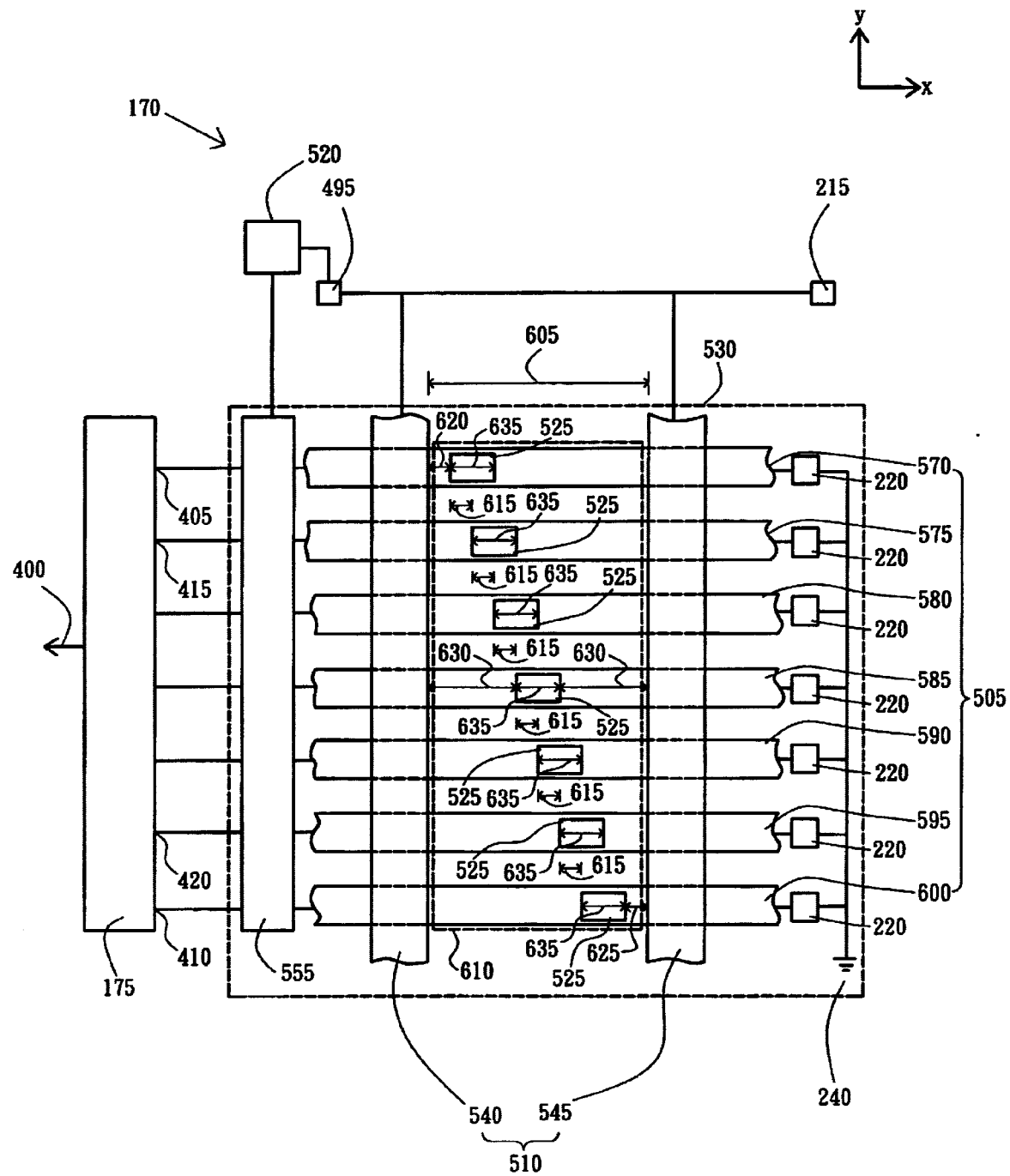
FIG. 7 is a top perspective view showing a preferred embodiment of the present invention according to FIG. 5.
Figure 8:
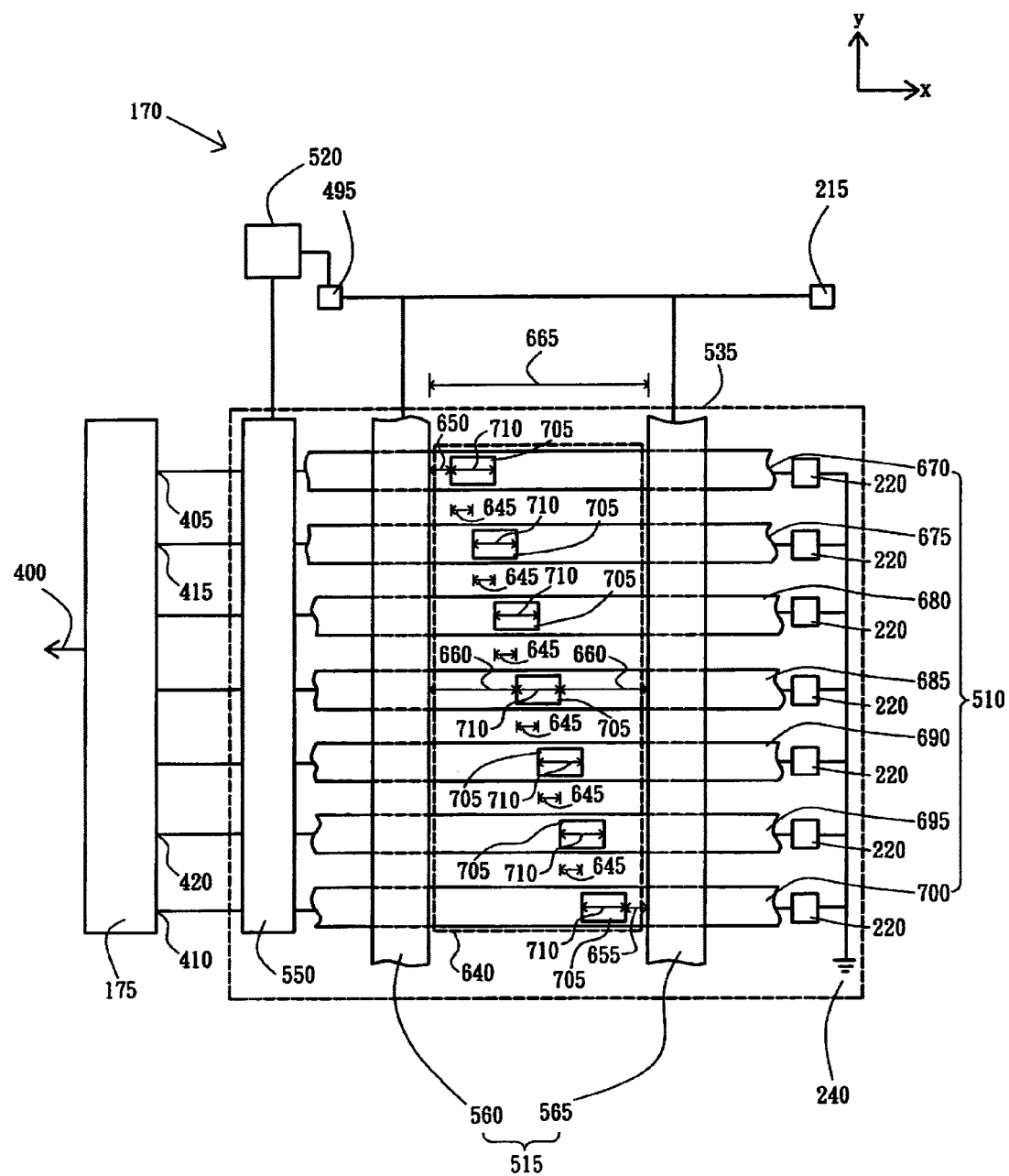
FIG. 8 is a top perspective view showing a preferred embodiment of the present invention according to FIG. 5.

Please referring to FIG. 6, FIG. 7 and FIG. 8, FIG. 7 is a top perspective view showing a preferred embodiment of the present invention according to FIG. 5, and FIG. 8 is a top perspective view showing a preferred embodiment of the present invention according to FIG. 5. For conveniently describing the operation theorems concerning the addressing module 520 and the metal-layer insulation module 555, the detecting circuit 535 shown in FIG. 6 is not shown in FIG. 7. The constitution of the detecting circuit 530 shown in FIG. 7 is similar to that of the detecting circuit 300 shown in FIG. 4, but the difference between detecting circuit 530 and the detecting circuit 300 are that the detecting circuit 530 shown in FIG. 7 is electrically connected to the register 175 through the metal-layer insulation module 555.

If the required detecting range of detecting via mismatch range is about 0.12 μm, and the required sensitivity of detecting via mismatch is about 0.03 μm, and the size 635 of each via 525 is about 0.28 μm, according to the formula (1), the quantity of metal line of the metal layer 505 shown in FIG. 7 is seven (i.e. metal lines 570, 575, 580, 585, 590, 595 and 600. The metal layer 510 shown in FIG. 7 is composed of a metal line 540 and a metal line 545.

Thus, according to the required detecting range of detecting via mismatch range and the size 635 of via 525, the metal line distance 605 between the metal line 540 and the metal line 545 can be resolved and is about 0.54 μm, and the corresponding distance 615 between vias 525 is about 0.03 μm, and the corresponding distance 620 between the metal line 540 and the via 525 in the dielectric layer corresponding to the metal line 570 is about 0.03 μm, and the corresponding distance 625 between the metal line 545 and the via 525 in the dielectric layer corresponding to the metal line 600 is about 0.03 μm, and both the corresponding distance 630 between the metal line 540 and the via 525 in the dielectric layer corresponding to the metal line 585 and the corresponding distance 630 between the metal line 545 and the via 525 in the dielectric layer corresponding to the metal line 585 are 0.12 μm, wherein all vias shown in FIG. 7 are placed within the rectangular 610.

While detecting the mismatch distance of vias between the metal layer 505 and the metal layer 510, a first predetermined address is inputted to the addressing module 520 of the process via mismatch detecting device 170 as shown in FIG. 6. After the first predetermined address in the addressing module 520 is decoded, a power supply module 495 is activated to supply power to the metal lines 540 and 545 of the metal layer 510, and the metal-layer insulation module 550 (shown in FIG. 8) of the detecting circuit 535 is activated and the metal-layer insulation module 555 of the detecting circuit 530 is stopped, so that the detected result of via mismatch generated by the detecting circuit 530 can be saved in the register 175 through the metal-layer insulation module 555, and the circuit between the register 175 and detecting circuit 535 is opened and interrupted in order to avoid any signal or noise influencing the detected result of via mismatch generated by the detecting circuit 530.

In FIG. 8, similarly, in order to conveniently describe the operation theorems of the addressing module 520 and the metal-layer insulation module 550, the detecting circuit 530 shown in FIG. 6 is not shown in FIG. 8. The constitution of the detecting circuit 535 shown in FIG. 8 is similar to that of the detecting circuit 530 shown in FIG. 7.

If the required detecting range of detecting via mismatch range is 0.16 μm, and the required sensitivity of detecting via mismatch is about 0.04 μm, and the size 710 of via 705, is about 0.28 μm, according to the formula (1), the metal layer 510 shown in FIG. 8 is constructed by seven metal lines (i.e. the metal lines 670, 675, 680, 685, 690, 695 and 700). Therefore, according to FIG. 6, FIG. 7 and FIG. 8, it is known that total metal lines in the metal layer 510 are nine metal lines: the metal lines 540, 545, 670, 675, 680, 685, 690, 695 and 700. Moreover, the metal layer 515 is constructed by the metal lines 560 and 565. The detecting circuit 535 shown in FIG. 8 is electrically connected to the register 175 through the metal-layer insulation module 550.

Thus, according to the required detecting range of detecting via mismatch range and the size 710 of via 705, the metal line distance 665 between the metal line 560 and the metal line 565 can be resolved and is about 0.60 μm, and the corresponding distance 645 between vias 705 is about 0.04 μm, and the corresponding distance 650 between the metal line 560 and the via 705 in the dielectric layer corresponding to the metal line 670 is about 0.04 μm, and the corresponding distance 655 between the metal line 565 and the via 705 in the dielectric layer corresponding to the metal line 700 is about 0.04 μm, and both the corresponding distance 660 between the metal line 560 and the via 705 in the dielectric layer corresponding to the metal line 685 and the corresponding distance 660 between the metal line 565 and the via 705 in the dielectric layer corresponding to the metal line 685 are 0.16 μm, wherein all vias shown in FIG. 8 are placed within the rectangular 640.

Similarly, while detecting the mismatch distance of vias between the metal layer 510 and the metal layer 515, a second predetermined address is inputted to the addressing module 520 of the process via mismatch detecting device 170 shown in FIG. 6. After the first predetermined address in the addressing module 520 is decoded, a power supply module 495 is activated to supply power to the metal lines 560 and 565 of the metal layer 515, and the metal-layer insulation module 555 of the detecting circuit 530 is activated and the metal-layer insulation module 550 of detecting circuit 535 is stopped, so that the detected result of via mismatch generated by the detecting circuit 535 can be saved in the register 175 through the metal-layer insulation module 550, and the circuit between the register 175 and the detecting circuit 530 is interrupted as an open circuit to avoid any signal or noise influencing the detected result of via mismatch generated by the detecting circuit 535. The operation theorem of the process via mismatch detecting device 170 shown in FIG. 6, FIG. 7 and FIG. 8 is described as that of the process via mismatch detecting device 170 shown in FIG. 3 and FIG. 4 above, so the related description is omitted.

Furthermore, the values of the required detecting range of detecting via mismatch range, the required sensitivity of detecting via mismatch and etc., recited in FIG. 3, FIG. 4, FIG. 7 and FIG. 8 are used to describe the operation of the present invention in samples. Thus, the related values can be modified and adjusted according to different designs while implementing the present invention. Moreover, each component in the process via mismatch detecting device 170 of the present invention can be formed and manufactured by known semiconductor techniques, such as depositing, sputtering, etc.

In FIG. 6, FIG. 7 and FIG. 8, the embodiment of the present invention is applied on a chip having three metal layers. If the process via mismatch detecting device 170 of the present invention is applied on a chip having four metal layers, an embodiment of the present invention can be composed of a register 175, an addressing module 520, a power supply module 495 and at least three detecting circuits, wherein each of the detecting circuits comprises a metal-layer insulation module, a plurality of resistors and a plurality of metal lines that are corresponding to each other but located on different metal layers. Moreover, the process via mismatch detecting device 170 of the present invention can also be applied on the detection of contact mismatch between the substrate and the metal layer that is formed above the substrate, and the operation theorem is similar to that of detecting via mismatch between metal layers.

Hence, the process via mismatch detecting device 170 of the present invention can be modified according to the quantity of the metal layers in a chip, and meanwhile, the locations of vias placed and the quantity of metal lines in a detecting circuit can also be modified according to the required sensitivity of detecting mismatch and the required detecting range of detecting via mismatch range. In addition, if the detecting circuit shown in FIG. 3, or FIG. 4, or FIG. 7, or FIG. 8 is implemented after being rotated ninety degrees horizontally, the via mismatch along the y direction can be detected by the process via mismatch detecting device of the present invention.

Figure 9:
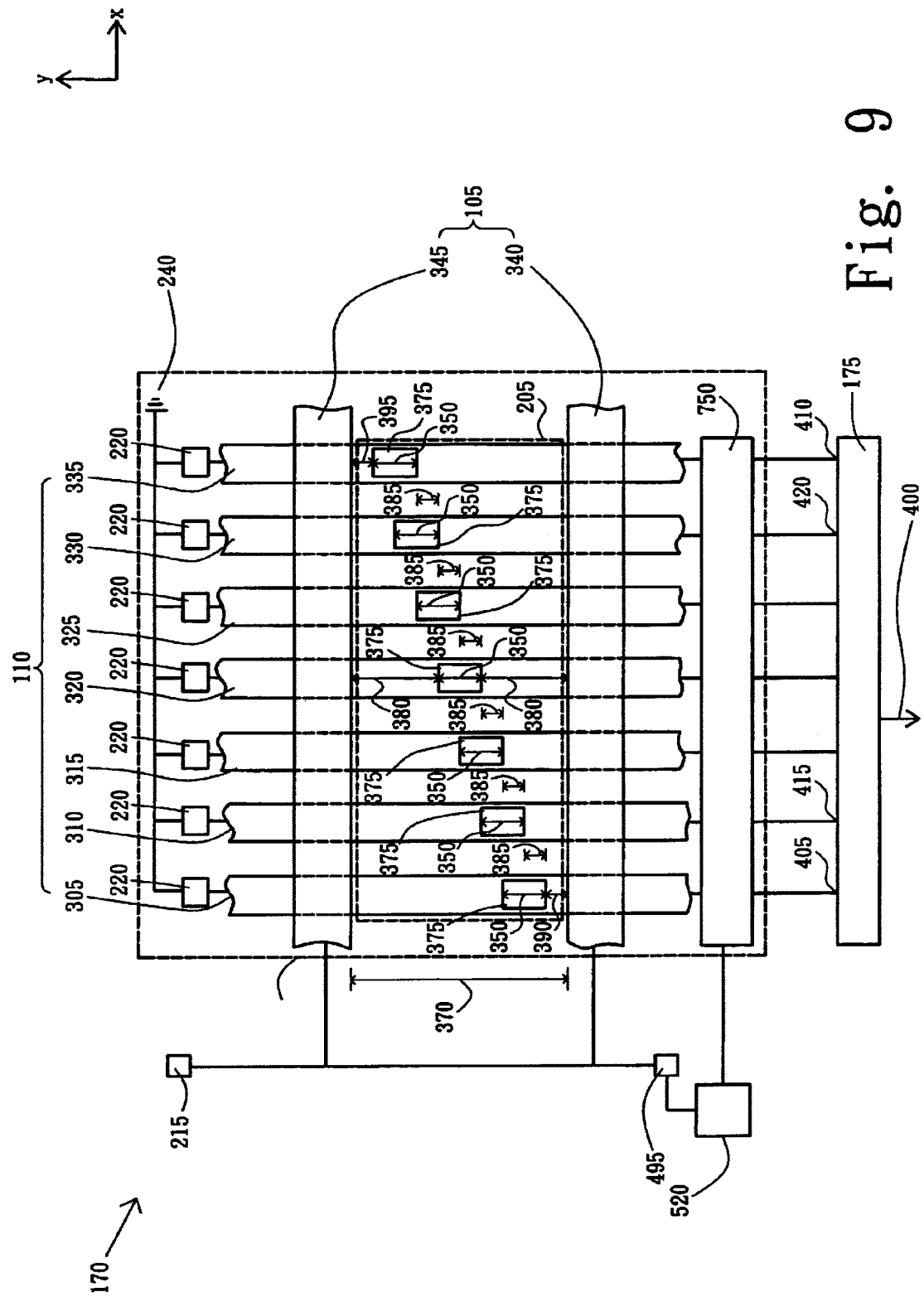
FIG. 9 is a top perspective view showing another embodiment of the present invention used for detecting the via mismatch in y direction while being applied on a chip having two metal layers.

Please referring to FIG. 9, FIG. 9 is a top perspective view showing another embodiment of the present invention that is used to detect the via mismatch along the y direction and is applied on a chip having two metal layers, wherein the process via mismatch detecting device 170 shown in FIG. 9 is similar to the process via mismatch detecting device 170 shown in FIG. 4, but the differences are that the metal line 305, the metal line 310, the metal line 315, the metal line 320, the metal line 325, the metal line 330 and the metal line 335 are electrically connected to the register 175 through a metal-layer insulation module 750; and the power supply module 495 and the metal-layer insulation module 750 are controlled by an addressing module 520. Therefore, the detecting circuit shown in FIG. 4, or FIG. 7 or FIG. 8 and that shown in FIG. 9 can be utilized in the process via mismatch detecting device of the present invention and be connected with each other like the connection shown in FIG. 6 while the mismatches of vias between the metal layers along the x direction and the y direction are detected, so that the goal of simultaneously detecting the via mismatch along the x direction and the y direction is achieved.

In conclusion, the quantity and placement direction of the detecting circuit; the quantity of metal lines in each of the metal layers of the detecting circuit; the placement and quantity of the vias; and the implementations of register, addressing module, metal-layer insulation module and power supply module are not limited to the descriptions of such as the aforementioned embodiments, and can be modified and adjusted in accordance with the quantity of metal layers on a chip, etc., in the process via mismatch detecting device of the present invention, so that the process via mismatch detecting device of the present invention has the advantages of broader utilization and flexible design.

The advantage of the present invention is to provide a process via mismatch detecting device. While the vias between the metal layers on the chips are mismatched, the vias on the detecting circuits of the process via mismatch detecting device are mismatched as well, so as to trigger the short circuits between different metal lines located on different metal layers by appropriately placing the vias on the detecting circuits after vias of detecting circuits are mismatched, and then the detected result of via mismatch is outputted. Therefore, the process via mismatch detecting device can find out whether the vias between the metal layers on the chip are mismatched or not and obtain the mismatch direction and the mismatch distances efficiently and accurately, so as to make an appropriate adjustment and optimization on a process.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A process via mismatch detecting device, wherein the process via mismatch detecting device is utilized in a chip having a first metal layer and a second metal layer, the process via mismatch detecting device comprising:

a detecting circuit, comprising:

the first metal layer comprising a first metal line and a second metal line, wherein a distance between the first metal line of the first metal layer and the second metal line of the first metal layer is a metal-line distance, and a terminal of the first metal line of the first metal layer and a terminal of the second metal line of the first metal layer are electrically connected to a power source respectively;

the second metal layer comprising a first metal line, a second metal line and a third metal line, wherein a terminal of the first metal line of the second metal layer is electrically connected to a terminal of a first resistor, and another terminal of the first resistor is electrically connected to a ground, and a terminal of the second metal line of the second metal layer is electrically connected to a terminal of a second resistor, and another terminal of the second resistor is electrically connected to the ground, and a terminal of the third metal line of the second metal layer is electrically connected to a terminal of a third resistor, and another terminal of the third resistor is electrically connected to the ground, and the first metal layer is located above the second metal layer and is placed orthogonally to the second metal layer, and a dielectric layer, which is located between the first metal layer and the second metal layer, and according to a predetermined via placement method, a first via is formed at a first predetermined location of the dielectric layer corresponding to the first metal line of the second metal layer, and a second via is formed in a second predetermined location of the dielectric layer corresponding to the second metal line of the second metal layer, and a third via is formed in a third predetermined location of the dielectric layer corresponding to the third metal line of the second metal layer; and a register, wherein the register has a first input terminal, a second input terminal, a third input terminal and a output terminal, and the first input terminal is electrically connected to another terminal of the first metal line of the second metal layer, and the second input terminal is electrically connected to another terminal of the second metal line of the second metal layer, and the third input terminal is electrically connected to another terminal of the third metal line of the second metal layer, and the output terminal outputs a detected result of the process via mismatch detecting device.

2. The process via mismatch detecting device of claim 1, wherein the second metal layer further has a metal-line quantity indicating the number of metal lines in the second metal layer.

3. The process via mismatch detecting device of claim 2, wherein the predetermined via placement method is used to obtain the metal-line quantity by subtracting one from a result generated by a via-mismatch detecting range multiplied by two and divided by a via-mismatch detecting sensitivity, thereby making the first predetermined location fall into a rectangle region of the dielectric layer, and a distance between the first predetermined location and a point crossed by the first metal line of the first metal layer and the first metal line of the second metal layer is a value of the via-mismatch detecting sensitivity; making the third predetermined location fall into the rectangle region of the dielectric layer, and a distance between the third predetermined location and a point crossed by the second metal line of the first metal layer and the third metal line of the second metal layer is the value of the via-mismatch detecting sensitivity; and making the second predetermined location fall into the rectangle region of the dielectric layer, and a distance between the second predetermined location and a point crossed by the first metal line of the first metal layer and the second metal line of the second metal layer is a value of the via-mismatch detecting range, and a distance between the second predetermined location and a point crossed by the second metal line of the first metal line and the second metal line of the second metal layer is the value of the via-mismatch detecting range also, and meanwhile, a first corresponding distance between the first predetermined location and the second predetermined location is the value of the via-mismatch detecting sensitivity, and the second corresponding distance between the second predetermined location and the third predetermined location is the value of the via mismatch detecting sensitivity, wherein the rectangle region is formed by the first metal line of the first metal layer, the second metal line of the first metal layer, the first metal line of the second layer and the third metal line of the second metal layer.

4. The process via mismatch detecting device of claim 3, wherein the first via has a first size, the second via has a second size, and the third via has a third size.

5. The process via mismatch detecting device of claim 4, wherein the first size, the second size and the third size are equal to a standard size.

6. The process via mismatch detecting device of claim 5, wherein the value of the metal-line distance is the standard size plus the via-mismatch detecting range multiplied by two.

7. The process via mismatch detecting device of claim 3, wherein a high level signal is received by one of the first input terminal and the third input terminal of the register, and a first low level signal is received by another one of the first input terminal and the third input terminal of the register, and a second low level signal is received by the second input terminal of the register when a mismatch range of the first via, the second via and the third, via is between the via-mismatch detecting range and the via-mismatch detecting sensitivity.

8. The process via mismatch detecting device of claim 3, wherein a first high level signal is received by one of the first input terminal and the third input terminal of the register, and a low level signal is received by another one of the first input terminal and the third input terminal of the register, and a second high level signal is received by the second input terminal of the register when a mismatch range of the first via, the second via and the third via is equal to between the via-mismatch detecting range.

9. The process via mismatch detecting device of claim 1, wherein the first input terminal is electrically connected to another terminal of the first metal line of the second metal layer through a first buffer module, and the second input terminal is electrically connected to another terminal of the second metal line of the second metal layer through a second buffer module, and the third input terminal is electrically connected to another terminal of the third metal line of the second metal layer through a third buffer module.

10. A process via mismatch detecting device, wherein the process via mismatch detecting device is utilized in a chip having a plurality of metal layers, the process via mismatch detecting device comprising:

a power supply module;

a first detecting circuit comprising:

a first metal layer of the plurality of metal layers comprising a first metal line and a second metal line, wherein a distance between the first metal line of the first metal layer and the second metal line of the first metal layer is a first metal line distance, and a terminal of the first metal line of the first metal layer and a terminal of the second metal line of the first metal layer are electrically connected to the power supply module respectively;

a plurality of first metal lines on a second metal layer of the plurality of metal layers, the plurality of first metal lines comprising a first first metal line and a second first metal line and a third first metal line, wherein a terminal of the first first metal line is electrically connected to a terminal of a first resistor, and, another terminal of the first resistor is electrically connected to a ground, and a terminal of the second first metal line is electrically connected to a terminal of a second resistor, and another terminal of the second resistor is electrically connected to the ground, and a terminal of the third first metal line is electrically connected to a terminal of a third resistor, and another terminal of the third resistor is electrically connected to the ground, and the first metal layer is located above the second metal layer and is placed orthogonally to the second metal layer;

a first metal-layer insulation module comprising a first input terminal, a second input terminal, a third input terminal, a first output terminal, a second output terminal and a third output terminal, wherein the first input terminal of the first metal-layer insulation module is electrically connected to another terminal of the first first metal line, and the second input terminal of the first metal-layer insulation module is electrically connected to another terminal of the second first metal line, and the third input terminal of the first metal-layer insulation module is electrically connected to another terminal of the third first metal line; and a first dielectric layer, which is located between the first metal layer and the second metal layer, wherein according to a first predetermined via placement method, a first via is formed at a first predetermined location of the first dielectric layer corresponding to the first first metal line of the second metal layer, and a second via is formed at a second predetermined location of the first dielectric layer corresponding to the second first metal line of the second metal layer, and a third via is formed at a third predetermined location of the first dielectric layer corresponding to the third first metal line of the second metal layer;

a second detecting circuit comprising:

a plurality of second metal lines of the second metal layer of the plurality of metal layers comprising a first second metal line and a second second metal line, wherein a terminal of the first second metal line and a terminal of the second second metal line are electrically connected to the power supply module, and a distance between the first second metal line and the second second metal line is a second metal-line distance;

a third metal layer of the plurality of metal layers comprising a first metal line, a second metal line and a third metal line, wherein a terminal of the first metal line of the third metal layer is electrically connected to a terminal of a fourth resistor, and another terminal of the fourth resistor is electrically connected to the ground, and a terminal of the second metal line of the third metal layer is electrically connected to a terminal of a fifth resistor, and another terminal of the fifth resistor is electrically connected to the ground, and a terminal of the third metal line of the third metal layer is electrically connected to a terminal of a sixth resistor, and another terminal of the sixth resistor is electrically connected to the ground, and the second metal layer is located above the third metal layer, and the plurality of second metal lines of the second metal layer are placed orthogonally to the first metal line, the second metal line and the third metal line of the third metal layer;

a second metal-layer insulation module comprising a first input terminal, a second input terminal, a third input terminal, a first output terminal, a second output terminal and a third output terminal, wherein the first input terminal of the second metal-layer insulation module is electrically connected to another terminal of the first metal line of the third metal layer, and the second input terminal of the second metal-layer insulation module is electrically connected to another terminal of the second metal line of the third metal layer, and the third input terminal of the second metal-layer insulation module is electrically connected to another terminal of the third metal line of the third metal layer; and a second dielectric layer, which is located between the second metal layer and the third metal layer, wherein according to a second predetermined via placement method, a fourth via is formed at a fourth predetermined location of the second dielectric layer corresponding to the first metal line of the third metal layer, and a fifth via is formed at a fifth predetermined location of the second dielectric layer corresponding to the second metal line of the third metal layer, and a sixth via is formed at a sixth predetermined location of the second dielectric layer corresponding to the third metal line of the third metal layer;

a register having a plurality of register-input terminals and a register-output terminal, wherein a first register-input terminal of the plurality of register-input terminals is electrically connected to the first output terminal of the first metal layer insulation module and the first output terminal of the second metal layer insulation module, and the second register-input terminal of the plurality of register-input terminals is electrically connected to the second output terminal of the first metal layer insulation module and the second output terminal of the second metal layer insulation module, and the third register-input terminal of the plurality of register-input terminals is electrically connected to the third output terminal of the first metal layer insulation module and the third output terminal of the second metal layer insulation module, in order to receive a plurality of signals outputted from the first metal-layer insulation module and a plurality of signals outputted from the second metal-layer insulation module; and an addressing module, which is used to receive an address signal and to activate one of the first metal-layer insulation module and the second metal-layer insulation module and to stop the other of the first metal-layer insulation module and the second metal-layer insulation module in accordance with the address signal, so that one of the first metal-layer insulation module and the second metal-layer insulation module is electrically conducted to the plurality of register-input terminals, and the other of the first metal-layer insulation module and the second metal-layer insulation module is not electrically conducted to the plurality of register-input terminals.

11. The process via mismatch detecting device of claim 10, wherein the plurality of first metal lines of the second metal layer further have a first metal-line quantity indicating the number of the plurality of first metal lines in the second metal layer.

12. The process via mismatch detecting device of claim 11, wherein the first predetermined via placement method is used to obtain the first metal-line quantity by subtracting one from a result generated by a first via-mismatch detecting range multiplied by two and divided by a first via-mismatch detecting sensitivity, thereby making the first predetermined location fall into a first rectangle region of the first dielectric layer, and a distance between the first predetermined location and a point crossed by the first metal line of the first metal layer and the first first metal line of the plurality of first metal lines of the second metal layer is a value of the first via-mismatch detecting sensitivity; making the third predetermined location fall into the first rectangle region of the first dielectric layer, and a distance between the third predetermined location and a point crossed by the second metal line of the first metal layer and the third first metal line of the plurality of first metal lines of the second metal layer is the value of the first via-mismatch detecting sensitivity; and making the second predetermined location fall into the first rectangle region of the first dielectric layer, and a distance between the second predetermined location and a point crossed by the first metal line of the first metal layer and the second first metal line of the plurality of first metal lines of the second metal layer is a value of the first via-mismatch detecting range, and a distance between the second predetermined location and a point crossed by the second metal line of the first metal line and the second first metal line of the plurality of first metal lines of the second metal layer is the value of the first via mismatch detecting range also, and meanwhile, a first corresponding distance between the first predetermined location and the second predetermined location is the value of the first via-mismatch detecting sensitivity, and the second corresponding distance between the second predetermined location and the third predetermined location is the value of the first via-mismatch detecting sensitivity, wherein the first rectangle region is formed by the first metal line of the first metal layer, the second metal line of the first metal layer, the first first metal line of the plurality of first metal lines of the second metal layer, and the third first metal line of the plurality of first metal lines of the second metal layer.

13. The process via mismatch detecting device of claim 12, wherein the first via has a first size, the second via has a second size, and the third via has a third size.

14. The process via mismatch detecting device of claim 13, wherein the first size, the second size and the third size are equal to a first standard size.

15. The process via mismatch detecting device of claim 14, wherein the value of the first metal-line distance is the first standard size plus the first via-mismatch detecting range multiplied by two.

16. The process via mismatch detecting device of claim 12, wherein a high level signal of the plurality of signals outputted from the first metal-layer insulation module is received by one of the first register-input terminal and the third register-input terminal, and a first low level signal of the plurality of signals outputted from the first metal-layer insulation module is received by another one of the first register-input terminal and the third register-input terminal, and a second low level signal of the plurality of signals outputted from the first metal-layer insulation module is received by the second register-input terminal when a first mismatch range of the first via, the second via and the third via is between the first via-mismatch detecting range and the first via-mismatch detecting sensitivity.

17. The process via mismatch detecting device of claim 12, wherein a first high level signal of the plurality of signals outputted from the first metal-layer insulation module is received by one of the first register-input terminal and the third register-input terminal, and a low level signal of the plurality of signals outputted from the first metal-layer insulation module is received by another one of the first register-input terminal and the third register-input terminal, and a second high level signal of the plurality of signals outputted from the first metal-layer insulation module is received by the second register-input terminal when a first mismatch range of the first via, the second via and the third via is equal to between the first via-mismatch detecting range.

18. The process via mismatch detecting device of claim 10, wherein the third metal layer further has a second metal-line quantity indicating the number of of metal lines in the third metal layer.

19. The process via mismatch detecting device of claim 18, wherein the second predetermined via placement method is used to obtain the second metal-line quantity by subtracting one from a result generated by a second via-mismatch detecting range multiplied by two and divided by a second via-mismatch detecting sensitivity, thereby making the fourth predetermined location fall into a second rectangle region of the second dielectric layer, and a distance between the second predetermined location and a point crossed by the first second metal line of the plurality of second metal lines of the second metal layer and the first metal line of the third metal layer is a value of the second via-mismatch detecting sensitivity; making the sixth predetermined location fill into the second rectangle region of the second dielectric layer, and a distance between the sixth predetermined location and a point crossed by the second second metal line of the plurality of second metal lines of the second metal layer and the second metal line of the third metal layer is the value of the second via-mismatch detecting sensitivity; and making the fifth predetermined location fall into the second rectangle region of the second dielectric layer, and a distance between the fifth predetermined location and a point crossed by the first second metal line of the plurality of second metal lines of the second metal layer and the second metal line of the third metal layer is a value of the second via-mismatch detecting range, and a distance between the fifth predetermined location and a point crossed by the second second metal line of the plurality of second metal lines of the second metal layer and the second metal line of the third metal layer is the value of the second via-mismatch detecting range also, and meanwhile, a third corresponding distance between the fourth predetermined location and the fifth predetermined location is the value of the second via-mismatch detecting sensitivity, and the fourth corresponding distance between the fifth predetermined location and the sixth predetermined location is the value of the second via-mismatch detecting sensitivity, wherein the second rectangle region is formed by the first second metal line of the plurality of second metal lines of the second metal layer, the second second metal line of the plurality of second metal lines of the second metal layer, the first metal line of the third metal layer and the third metal line of the third metal layer.

20. The process via mismatch detecting device of claim 19, wherein the fourth via has a fourth size, the fifth via has a fifth size, and the sixth via has a sixth size.

21. The process via mismatch detecting device of claim 20, wherein the fourth size, the fifth size and the sixth size are equal to a second standard size.

22. The process via mismatch detecting device of claim 21, wherein the value of the second metal-line distance is the second standard size plus the second via-mismatch detecting range multiplied by two.

23. The process via mismatch detecting device of claim 19, wherein a high level signal of the plurality of signals outputted from the second metal-layer insulation module is received by one of the first register-input terminal and the third register-input terminal, and a first low level signal of the plurality of signals outputted from the second metal-layer insulation module is received by another one of the first register-input terminal and the third register-input terminal, and a second low level signal of the plurality of signals outputted from the second metal-layer insulation module is received by the second register-input terminal when a second mismatch range of the fourth via, the fifth via and the sixth via is between the second via-mismatch detecting range and the second via-mismatch detecting sensitivity.

24. The process via mismatch detecting device of claim 19, wherein a first high level signal of the plurality of signals outputted from the second metal-layer insulation module is received by one of the first register-input terminal and the third register-input terminal, and a low level signal of the plurality of signals outputted from the second metal-layer insulation module is received by another one of the first register-input terminal and the third register-input terminal, and a second high level signal of the plurality of signals outputted from the second metal-layer insulation module is received by the second register-input terminal when a second mismatch range of the fourth via, the fifth via and the sixth via is equal to between the second via-mismatch detecting range.

* * * * *